(12) United States Patent
Nakajima (10) Patent No.: US 7,062,724 B2
(45) Date of Patent: Jun. 13, 2006

(54) METHOD FOR DESIGNING A SYSTEM LSI

(75) Inventor: Hiroyuki Nakajima, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 23 days.

(21) Appl. No.: 10/329,578

(22) Filed: Dec. 27, 2002

(65) Prior Publication Data

US 2003/0126563 A1 Jul. 3, 2003

(30) Foreign Application Priority Data

Dec. 28, 2001 (JP) ............................. 2001-400503

(51) Int. Cl.
*G06F 17/50* (2006.01)

(52) U.S. Cl. ........................................... 716/1; 716/18

(58) Field of Classification Search .................... 716/1, 716/18; 709/107; 703/14–22; 712/34, 37
See application file for complete search history.

(56) References Cited

U.S. PATENT DOCUMENTS

| | | | |
|---|---|---|---|
| 5,748,979 A * | 5/1998 | Trimberger | 712/37 |
| 5,845,072 A | 12/1998 | Finney et al. | |
| 6,058,263 A | 5/2000 | Voth | |
| 6,223,274 B1 * | 4/2001 | Catthoor et al. | 712/34 |
| 6,477,683 B1 * | 11/2002 | Killian et al. | 716/1 |
| 6,760,888 B1 * | 7/2004 | Killian et al. | 716/1 |
| 2002/0152061 A1 * | 10/2002 | Shimogori et al. | 703/21 |
| 2003/0149962 A1 * | 8/2003 | Willis et al. | 717/135 |
| 2004/0006584 A1 * | 1/2004 | Vandeweerd | 709/107 |

FOREIGN PATENT DOCUMENTS

| | | |
|---|---|---|
| JP | 10-254725 | 9/1998 |
| WO | WO 96/37855 | 11/1996 |
| WO | WO 97/46959 | 12/1997 |

OTHER PUBLICATIONS

MP-SOC Workshop: From a distributed embedded RTOS to a pragmatic framework for multi-core SoC. Jul. 2001, available at: http://tima.imag.fr/MPSOC/2001/verhulst.pdf.
EDN ACCESS: Microprocessor and DSP technologies unite for embedded applications, Markus Levy, Mar. 2, 1998, available at: http://www.e-insite.net/ednmag/archives/1998/030298/05df_01.htm.
Otsubo et al., "Method of building a C term base designthrough applications to an LSI used for a portable terminal", NEC Information Nippon Electric Co., Ltd., Mar. 23, 2001, vol. 54, No. 3, pp. 187-190.
Wakabayashi et al., "C-Based SoC Design Flow and EDA Tools: An ASIC and System Vendor Perspective", IEEE Transactions on Computer-Aided Design of Integrated Circuits and Systems, IEEE, Dec. 2000, vol. 19, No. 12, pp. 1507-1522.

* cited by examiner

*Primary Examiner*—Stacy A. Whitmore
*Assistant Examiner*—Naum Levin
(74) *Attorney, Agent, or Firm*—Young & Thompson (57) ABSTRACT

A method for designing a system LSI includes the steps of dividing an algorithmic description of the system LSI into software and hardware groups, synthesizing the hardware group by behavior synthesis to create an RTL description and a simulation description, examining the circuit scale of the system LSI based on the RTL description, and simulating the system LSI based on the simulation description and a software description.

15 Claims, 6 Drawing Sheets

```
1   #define ADD 0x0        /* adder */
2   #define SUB 0x1        /* subtract */
3   #define MOV 0x3        /* move data */          } DEFINITION OF INSTRUCTION CODES
4   #define JMP 0x2        /* jump */
5   #define SET 0x4        /* set immidiate data */
6   #define USR 0xf        /* user defined inst */
7
8   #define PROGSIZE 256
9   #define DATASIZE 16
10  reg(0: 8) pc;                    /* 8 bit prog counter */            } DEFINITION OF MEMORY RESOURCES
11  reg(0:16) memP[PROGSIZE];        /* 256 word program memory */
12  reg(0: 8) memD[DATASIZE];        /* 16 byte data memory */
13
14  process cpu()                                                        DEFINITION OF INSTRUCTION DECODER BUSES
15  {
16    ter(0: 4) opc,opr1,opr2,opr3;   /* opcode operand wire */
17
18    opc::opr1::opr2::opr3=memP[pc];  /* instruction fetch */
19    switch(opc) { /* instruction decoce */
20    case ADD: memD[opr1]=memD[opr2] + memD[opr3]; pc++; break;                    BASIC INSTRUCTIONS
21    case SUB: memD[opr1]=memD[opr2] - memD[opr3]; pc++; break;                    RESOURCES: add, sub & inc
22    case MOV: memD[opr1]=memD[opr2] ; pc++; break;                                MEMORY PORTS: READ<2>,WRITE<1>
23    case JMP: pc=opr1 ; break;
24    case SET: memD[opr1]=opr2 :: opr3 ; pc++ ; break;
25    default:  op_user (opc,opr1,opr2,opr3); break;
26    }
27  }
28
29  void op_user(ter(0:4) opc, ter(0:4) opr1,ter(0:4) opr2, ter(0:4) opr3)
30  {
31    switch(opc) { /* user instruction decode */}                                  DEDICATED INSTRUCTIONS
32    case USR: memD[opr1]::memD[opr1+1]                                            RESOURCES: mul(*) acc(+)
33           = memD[opr1+1]::memD[opr1+1] + memD[opr2] * memD[opr3];                (ADD: 8-bit ADDER SHARED)
34           pc++; break;                                                           MEMORY PORTS: READ<4>,WRITE<2>
35    default: break;                                                               (ADD: READ<2>,WRITE<1>)
36    }
37  }
```

METHOD FOR DESIGNING A SYSTEM LSI

BACKGROUND OF THE INVENTION (a) Field of the Invention

The present invention relates to a method for designing a system LSI (large-scale integrated circuit) and, more particularly, to a method for designing a system LSI having a higher design choice of the band for the communication interface for transferring therethrough data between a basic-instruction processor and a dedicated-instruction processor. The present invention also relates to a recording medium for storing therein the software for designing such a system LSI.

(b) Description of the Related Art

In recent years, a system LSI, or system-on-chip LSI, is increasingly used which realizes all the circuit functions of a system on a single chip. In addition, along with the finer fabrication process of the semiconductor devices, the number of logic gates integrated on a system LSI has increased dramatically, wherein the system LSI has a higher processing performance accordingly.

The system LSIs are used for a variety of processings such as image processing, encryption, filtering, and decoding, wherein the input/output signals have a variety of formats, and a variety of algorithms are used for processing these signals. In addition, the system LSIs have a variety of throughputs depending on the performances requested for the processing. In the recent trend, the algorithms used in the system LSI become more and more complicated, and the throughputs for the processing are significantly improved.

For the reasons as described heretofore, the recent system LSIs are designed for dedicated processing for the signals used therein.

Figure 5:
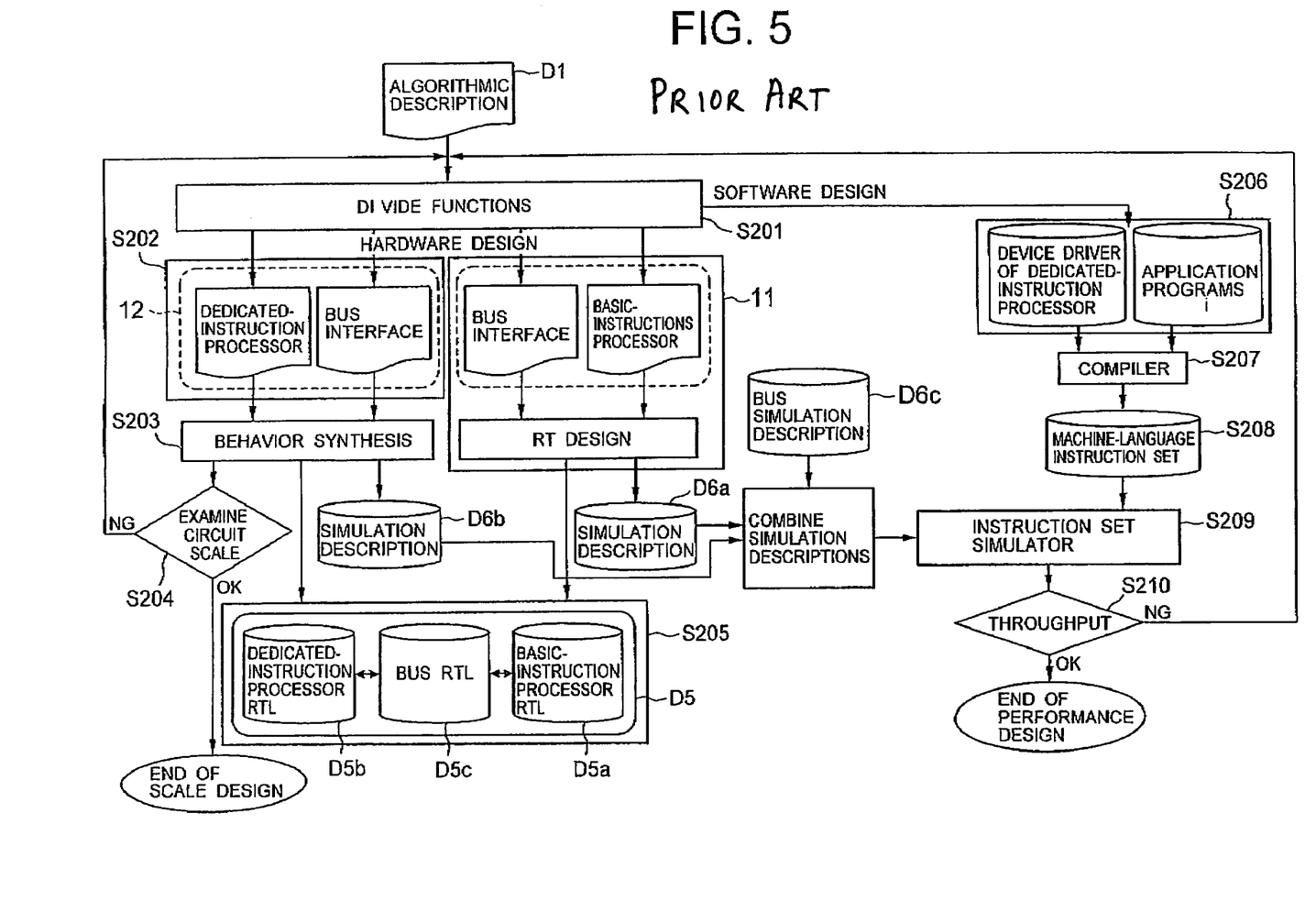
FIG. 5 is a flowchart of the conventional method for designing a system LSI.

FIG. 5 shows a flowchart for designing a system LSI by using a software-hardware-collaborated (SHC) design system. In general, in the SHC design system using a behavior synthesis, an algorithmic description D1 described in a general-purpose language such as C language, or another higher-level language such as a dedicated language used for the operational level description is translated into a lower-level-language description, such as a logic synthesis RTL (register transfer level) description D5. The RTL description can be converted into hardware by using hardware resources including a memory such as a register, and a processor such as an adder.

Figure 1:
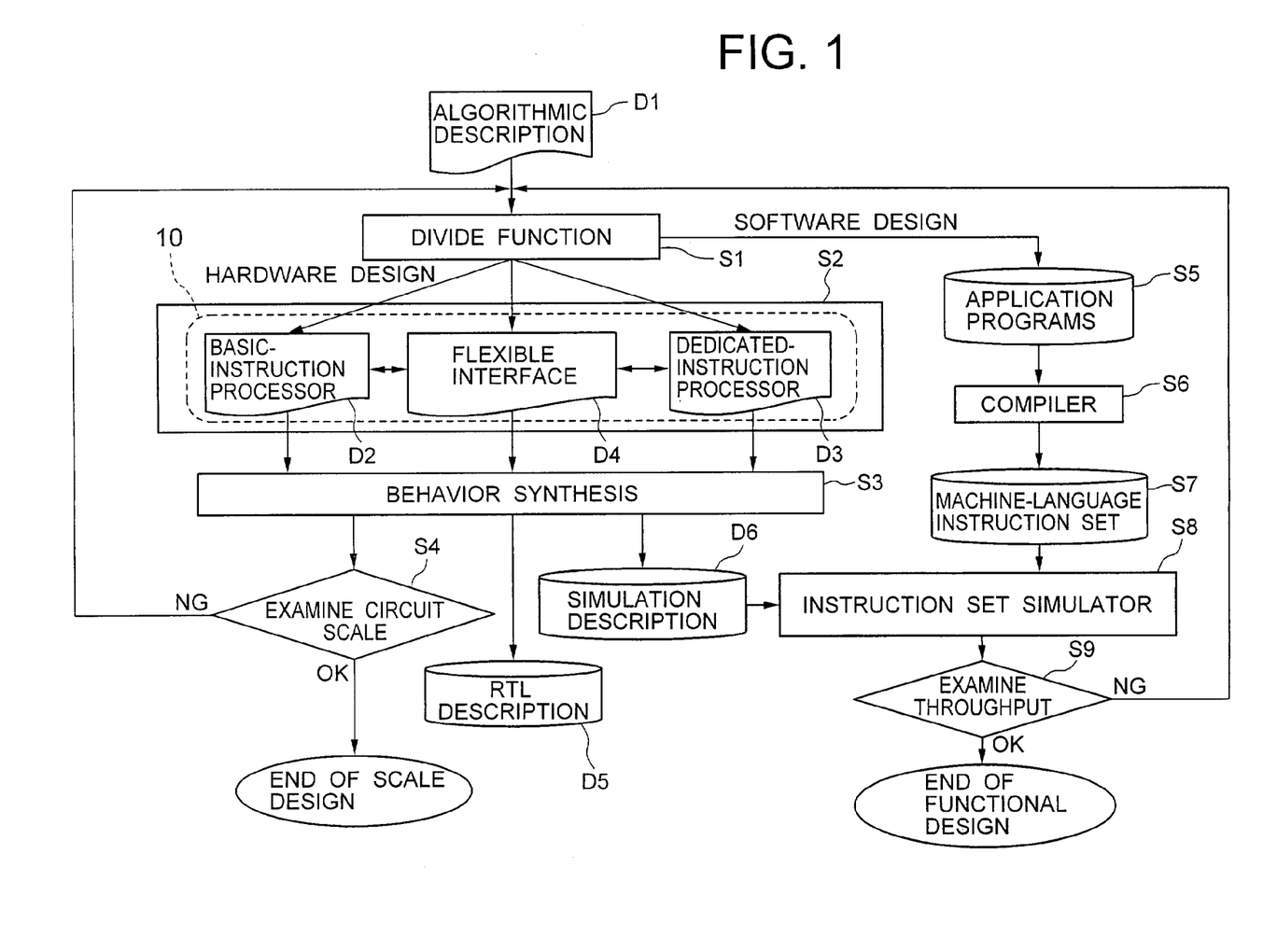
FIG. 1 is a flowchart of a method for designing a system LSI according to an embodiment of the present invention.

The algorithmic description D1 describes all the functions of the system LSI. If the most part of the functions are to be implemented by hardware, the system LSI has a larger circuit scale and is thus expensive, although the system LSI has a higher throughput for the processing. On the other hand, if the most part of the functions are to be implemented by software, the system LSI has a lower throughput, although the system LSI has a smaller circuit scale. Accordingly, in the initial stage of the design, as shown in FIG. 1, the functions described in the algorithmic description D1 are divided into two groups in consideration of the constraints (or settings) for the system LSI including circuit scale, throughput performance for processing, cost etc. (step S201). The two groups include a first group implemented by hardware resources, and a second group implemented by software resources.

If all the hardware resources are designed for all the details thereof, the development for the hardware resources will take higher cost and longer time length. For this reason, hardware macros designed in the past and stored as hardware intellectual property (IP) are reused, while utilizing the stored resources as much as possible. The hardware IP is generally designed in consideration of reuse feasibility and higher versatility, and thus is installed with ease in the structure of the system LSI.

The hardware is designed as a combination of a basic-instruction processor 11 such as a microprocessor for processing versatile calculations and a dedicated-instruction processor 12 dedicated to specific processings such as an input/output processing. A hardware IP designed before is generally used as the basic-instruction processor 11. The basic-instruction processor 11 is designed by another division in the semiconductor maker other than the division which develops the system LSI, the another division being dedicated to designing processors by using a register transfer design technique. The description for the basic-instruction processor 11 is presented together with simulation description D6$a$.

After the basic-instruction processor 11 to be used in the system LSI is determined, the process advances to design for the dedicated-instruction processor 12 (step S202). Since the dedicated-instruction processor 12 and the basic-instruction processor 11 communicate data therebetween via buses, the design for the bus interface of the dedicated-instruction processor 12 is performed consistent with the bus specification of the basic-instruction processor 11. The design for the dedicated-instruction processor 12 is expressed in a high-level language.

From the description of the dedicated-instruction processor 12, an RTL description D5$b$ of the dedicated-instruction processor 12 and a simulation description D6$b$ are obtained (step S203). It is judged in step S204 whether or not the RTL description D5$b$ of the dedicated-instruction processor 12 can realize a circuit scale within a setting previously established as a constraint for the system LSI. If the circuit scale is above the setting, the process returns to step S201, wherein the design for the system LSI is iterated from the start. If it is judged in step S204 that the circuit scale is within the setting, the RTL description D5$a$ of the basic-instruction processor 11 and the description D5$b$ of the dedicated-instruction processor 12 are coupled via the RTL description 5$c$ of the buses (step S205).

Subsequently, in the software design, application programs and a device driver for operating thereon the dedicated-instruction processor 12 are defined in a high-level language (step S206). The application programs and the device driver are complied and translated into the machine-language instructions which the basic-instruction processor 11 or the dedicated-instruction processor 12 can directly understand by using a compiler (compiler/assembler/linker) (step S207). The machine-language instructions thus obtained (step S208), the simulation descriptions D6$a$ and D6$b$ and the bus simulation description D6$c$ are combined to form an overall simulation description, which is input to an instruction set simulator, wherein a simulation is performed in an environment similar to the environment of the system LSI (step S209).

By simulating the hardware and software in the instruction set simulator, it is examined or verified that there is no error in the design of the hardware and software. In step S209, the time-domained throughput performance and power consumption of the system LSI is also measured under the actual service condition, and it is judged whether or not the throughput thus measured satisfies the performance required of the system LSI (step S210). If the result of judgement is negative, the process returns to step S201, wherein the division of functions into software and hardware groups is corrected. If the result of judgement is affirmative in step S210, the design for the system LSI is completed, followed by logic synthesis of the RTL description D5a of the basic-instruction processor 11, the RTL description D5b of dedicated-instruction processor 12, and the bus RTL description D5c is performed to determine the actual gate circuit of the system LSI.

Figure 6:
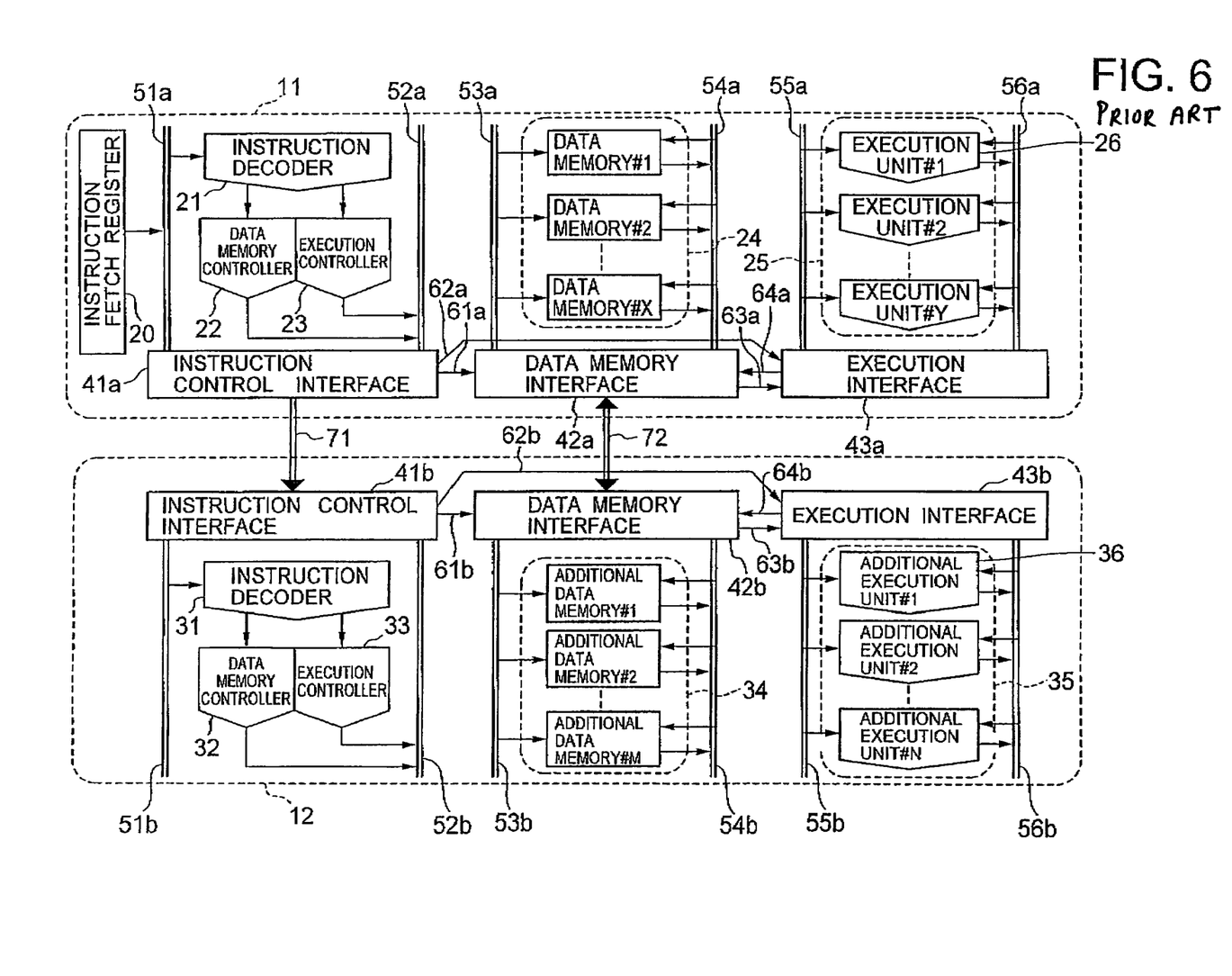
FIG. 6 is a functional block diagram of the system LSI designed by the method of FIG. 5.

FIG. 6 shows the configuration of the system LSI obtained by the conventional design as described heretofore. The system LSI includes the basic-instruction processor 11 and the dedicated-instruction processor 12, which are interconnected via an instruction control bus 71 and a data communication bus 72. The basic-instruction processor 11 includes: an instruction control block including an instruction decoder 21, a data memory controller 22, and an execution controller 23; a data memory block 24; an execution block 25; an instruction control interface 41a; a data memory interface 42a; an execution interface 43a; and an instruction fetch register 20. The dedicated-instruction processor 12 includes: an instruction control block including an instruction decoder 31, a data memory controller 32, and an execution controller 33; a data memory block 34; an execution block 35; an instruction control interface 41b; a data memory interface 42b; and an execution interface 43a.

An instruction data bus 51a and an instruction control bus 52a are connected to the instruction control interface 41a. A memory selection bus 53a and a memory access bus 54a are connected to the data memory interface 42a. An execution selection bus 55a and an execution access bus 56a are connected to the execution interface 43a.

The instruction control interface 41a delivers a control signal for controlling the data memory interface 42a via the memory control bus 61a, and also delivers a control signal for controlling the execution interface 43a via the execution control bus 62a. The data memory interface 42a selects a data memory via the memory selection bus 53a based on the control signal received from the instruction control interface 41a, thereby controlling the timing of read/write (R/W) of the data delivered via the memory access bus 54a.

The execution interface 43a selects an execution unit 26 via the execution selection bus 55a based on the control signal received from the instruction control interface 41a, thereby controlling input/output (I/O) of the data via the execution access bus 56a and reading/writing data from/to the data memory block 24 via the read access bus 63a and the write access bus 64a.

An instruction data bus 51b and an instruction control bus 52b are connected to the instruction control interface 41b. A memory selection bus 53b and a memory access bus 54b are connected to the data memory interface 42b. An execution selection bus 55b and an execution access bus 56b are connected to the execution interface 43b.

The instruction control interface 41b delivers a control signal for controlling the data memory interface 42b via the memory control bus 61b, and also delivers a control signal for controlling the execution interface 43b via the execution control bus 62b. The data memory interface 42b selects a data memory via the memory selection bus 53b based on the control signal received from the instruction control interface 41b, thereby controlling the timing of R/W of data via the memory access bus 54b. The execution interface 43b selects an execution unit 36 via the execution selection bus 55b based on the control signal received from the instruction control interface 41b, thereby controlling I/O of data via the execution access bus 56b and reading/writing the data of the data memory block 34 via the read access bus 63b and the write access bus 64b.

The instruction control interfaces 41a and 41b are connected together via an instruction control bus 71. The data memory interfaces 42a and 42b are connected together via a data communication bus 72. The dedicated-instruction processor 12 accesses the instruction fetch register 20 via the instruction control bus 71, thereby reading/writing data from/to the data memory block 24 via the data communication bus 72. The number of the data memories to which the dedicated-instruction memory 12 can simultaneously access in the memory block 24 is defined by the bus-band of the data communication bus 72.

In the conventional design as described above, the interfaces and the buses disposed between the basic-instruction processor 11 and the dedicated-instruction processor 12 are determined and fixed based on the specification of the basic-instruction processor 11, wherein the resources of the processors 11 and 12 are shared therebetween under the fixed conditions. For example, if the bus-band of the data communication bus 72 is smaller than the number of data memories that the dedicated-instruction processor 12 can simultaneously access in the data memory block 24, the access cannot be performed at a single clock cycle and takes a number of clock cycles due to the smaller bus-band.

In addition, although the basic-instruction processor 11 includes therein versatile calculation resources in the execution block 25, the execution block 25 cannot be accessed from the execution block 35, because there is no bus between the execution block 25 and the execution block 35. For this reason, even if the basic-instruction processor 11 and the dedicated-instruction processor 12 operate for calculation of the same rule of arithmetic, the calculation resources are separately disposed for both the processors 11 and 12.

The simulation descriptions input to the instruction set simulator for the verification of operation of the system LSI are created separately during the respective designs for the basic-instruction processor 11, dedicated-instruction processor 12 and the bus block. Since the instruction set simulator combines the separate simulation descriptions for verification of the operation of the system LSI, the instruction set simulator must verify the communication between the basic-instruction processor 11 and the dedicated-instruction processor 12 as well as the device driver of the dedicated-instruction processor 12 in a low-level language, after the design for the bus block is completed. This verification is complicated and consumes a long time.

An "Xtensa" processor was recently proposed which can solve the above problems in the conventional technique, by changing the resources such as the memory size based on the settings (or constraints), such as number of gates, throughput and power dissipation, in a user-specific LSI to restructure the basic-instruction processor architecture (refer to Design Wave Magazine 1999, December). In the proposed processor, an additional interface is defined for the dedicated instructions separately from the interface of the basic-instruction processor to be restructured.

Another processor called VUPU processor is also known which has dedicated instructions obtained by behavior synthesis which translates the language of the operational level description of the user-specific dedicated-instruction processor architecture into the RTL description. The VUPU processor can be operated by the instruction from the basic-instruction processor (refer to Design Wave Magazine1999, December).

In the proposed VUPU processor, the basic-instruction processor architecture and the interface for adding dedicated instructions thereto are defined, wherein the basic-instruction processor architecture and the dedicated-instruction processor architecture are separated.

SUMMARY OF THE INVENTION

It is therefore an object of the present invention to provide a method for designing a system LSI which has a higher design choice for the band of the communication interface transferring data between the basic-instruction processor and the dedicated-instruction processor, and which can be fabricated at a lower cost by allowing hardware resources to be shared between the basic-instruction processor and the dedicated-instruction processor.

It is another object of the present invention to provide a recording medium storing therein the program for designing such a system LSI.

The present invention provides a method for designing a system LSI operating on specific software, the method including the steps of: describing functions of a basic-instruction processor, a dedicated-instruction processor and a communication interface transferring data between the basic-instruction processor and the dedicated-instruction processor, to thereby create an algorithmic description; and synthesizing the algorithmic description by using a behavior synthesis to create a lower-level-language description for the basic-instruction processor, dedicated-instruction processor and communication interface.

In accordance with the method of the present invention, since the basic-instruction processor, dedicated-instruction processor and communication interface described in an algorithm are subjected to behavior synthesis, the communication interface can be flexibly structured and a higher design choice for the communication interface can be obtained.

The present invention also provides a recording medium storing therein software for achieving the method of the present invention.

The above and other objects, features and advantages of the present invention will be more apparent from the following description, referring to the accompanying drawings.

PREFERRED EMBODIMENTS OF THE INVENTION

In a preferred embodiment of the present invention, the algorithmic description may be a C language, or a C language combined with another language such as a C++ language. It is also preferable that the basic-instruction processor and the dedicated-instruction processor share therebetween one or more hardware resources. This reduces the number of hardware resources in the system LSI. The hardware resources thus shared may include memory resource, calculation resource, multiplexer, and interconnection resource such as a bus.

The behavior synthesis step may preferably determine the band of the communication interface transferring data between the processors. By determining the band of the communication interface based on the descriptions for the basic-instruction processor and the dedicated-instruction processor, a suitable scale for the band of the communication interface can be obtained without an excess or deficiency.

The behavior synthesis step may preferably yield the simulation description for collectively simulating the basic-instruction processor, dedicated-instruction processor and communication interface. This allows the operation verification to be performed with ease.

The method of the present invention may include a simulation step which is performed based on the simulation description and a software description which includes a machine-language instruction set, thereby allowing the practical operation of the system LSI to be verified with ease.

A change of the specification of the system LSI or modification of the system LSI for removing a malfunction thereof, which may occur after the behavior synthesis step, is preferably replaced by modification of a portion of the software description, which specifies basic instructions in the basic-instruction processor and/or dedicated instructions in the dedicated-instruction processor.

In an alternative or in addition thereto, the dedicated-instruction processor may have a redundancy portion including a programmable logic circuit, which may be used instead of the change of the specification or the modification for removing the malfunction. The programmable logic circuit and/or a circuit portion to be restructured by modifying the interconnections in the system LSI may be used for the change of specification and/or the modification for removing the malfunction.

The description for the basic-instruction processor may be created by combining desired instructions extracted from a basic-instruction processor library. In addition, at least a part of the description of instructions in the dedicated-instruction processor is stored in the basic-instruction processor library after the design. In such a case, the basic-instruction processor may be flexibly structured and restructured by using only desired basic instructions. The usage of the library may reduce the time length and cost for the development of the system LSI.

The design for the system LSI may combine a plurality of dedicated-instruction processors and at least one basic-instruction processor for achieving a higher operational speed. The design for the system LSI may use the C language among the higher-level languages, which is suited to describe the functions of the system LSI. A plurality of languages extended from the C language, such as C++ language, another modified language suited to express the behavior synthesis or an object-oriented language, may also be used for defining the algorithmic description.

Now, the present invention is more specifically described with reference to accompanying drawings, wherein similar constituent elements are designated by similar reference numerals throughout the drawings.

Figure 2:
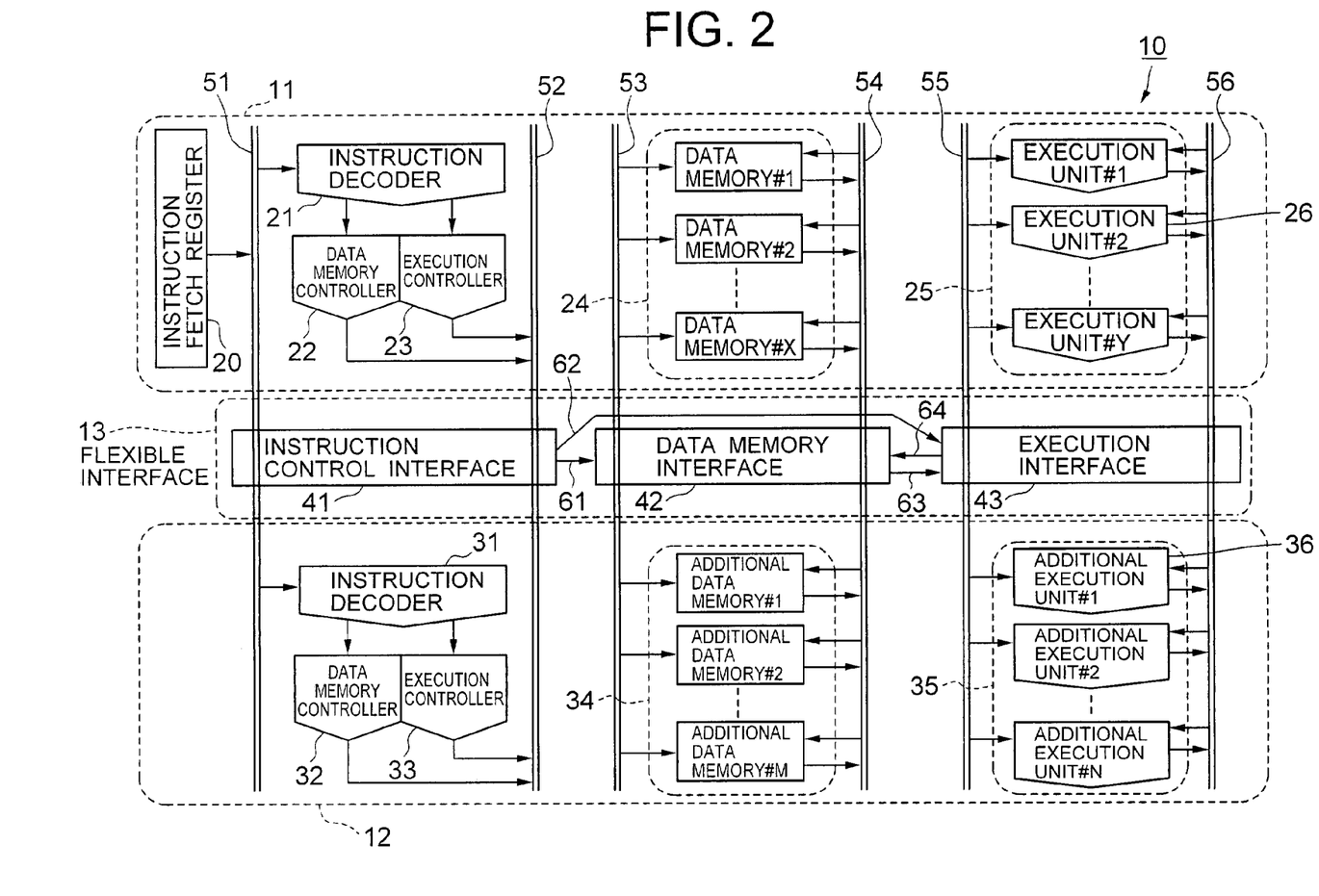
FIG. 2 is a functional block diagram of the system LSI designed by the method of FIG. 1.

Referring to FIG. 1, there is shown a procedure for designing a system LSI according to an embodiment of the present invention using a software-hardware-collaborated (SHC) design system. The procedure of FIG. 1 provides a system LSI such as shown in FIG. 2.

In FIG. 1, the SHC design system uses a behavior synthesis technique by translating the algorithmic description D1 described in a general-purpose language, such as the C language, or another higher-level language, such as a dedicated language for the operational level description, is translated into a lower-level-language description, such as a logic synthesis RTL (register transfer level) description D5. The RTL description is generally suited to translation into hardware by using hardware resources including a memory such as a register, and a processor such as an adder.

The algorithmic description D1 of the system LSI is divided into two groups in consideration of the circuit scale, throughput performance for processing, power dissipation etc. (step S1), the two groups including a first group to be implemented by hardware resources, and a second group to be implemented by software resources. The design for the hardware group selects a basic-instruction processor 11, which operates as a core of the processor block 10, having designed instructions.

Subsequently, a dedicated-instruction processor 12 executing specific instructions is added in the processor block 10, if the basic-instruction processor 11 cannot afford a desired processing performance in terms of throughput etc. Thus, the processor block 10 includes the dedicated-instruction processors 12 having specific instructions and the basic-instruction processor 11 having a configuration obtained by combining designed basic instructions.

In the design for the processor block 10, the functions thereof are described in a high-level language (step S2). The resultant description of the processor block 10 includes a first description D2 for the basic-instruction processor description 11, a second description D3 for the dedicated-instruction processor 12, and a third description D4 for a flexible interface group 13. The description D2 for the basic-instruction processor 11 is obtained by combining instructions extracted from the instruction library based on the algorithmic description D1. The functions of the dedicated-instruction processor 12 are defined by the description D3 for the dedicated-instruction processor. The flexible interface group 13 couples the basic-instruction processor 11 and the dedicated-instruction processor 12 together and is defined by the description D4 for the flexible interface.

The flexible interface group 13 includes an instruction control interface 41, a memory access interface 42, and an execution interface 43. As will be detailed later, the band (such as the number of bus lines) of each bus coupling the interfaces together is determined by the contents of the descriptions D2 and D3 of the basic-instruction processor 11 and the dedicated-instruction processor 12. The basic-instruction processor 11 and the dedicated-instruction processor 12 can share hardware resources therebetween via the flexible interface group 13.

The behavior synthesis of the descriptions for the processor block 10 in step S3 yields an RTL description D5 and a simulation description D6. The simulation description D6 is used for an operation verification of the processor block 10 at a clock cycle level. The RTL description D5 is used for examining the circuit scale of the processor block 10 in step S4, wherein if the resultant circuit scale exceeds the setting (constraint for the system LSI), then the process returns to step S1 to iterate the steps S1 to S4. If it is judged in step S4 that the circuit scale is within the setting, then the configuration of the hardware is fixed.

In the design of the software group, application programs are described in a high-level language (Step 35), to thereby determine the operation of the system LSI to be obtained. After the contents of the program files are fixed, the programs are compiled by using a compiler/assembler/linker (step S6), thereby creating a machine-language instruction set which the processor block 10 can directly understand (step S7). The resultant machine-language instruction set and the simulation description D6 obtained in step S3 are input to the instruction set simulator (step S8) to examine the absence of an error in the design.

In the simulation by the instruction set simulator, the throughput performance of the system LSI is measured. If it is judged in step S9 that the processing time length is above the setting to exhibit a lower throughput performance, the process returns to step S1 to redesign the system LSI for the division of the algorithm description between the hardware group and the software group. If it is judged in step S9 that the processing time length is within the setting, the design of the system LSI is completed whereby the processor block 10 and the application programs are fixed for the system LSI.

As shown in FIG. 2, the resultant processor block 10 includes the basic-instruction processor 11, dedicated-instruction processor 12, and flexible interface group 13. The basic-instruction processor 11 includes: an instruction controller including an instruction decoder 21, a data memory controller 22, and an execution controller 23; a data memory block 24; an execution block 25; and an instruction fetch register 20. The dedicated-instruction processor 12 includes: an instruction controller including an instruction decoder 31, a data memory controller 32, and an execution controller 33; a data memory block 34; and an execution block 35.

The flexible interface group 13 includes an instruction control interface 41, a data memory interface 42, and an execution interface 43. A instruction data bus 51 and an instruction control bus 52 are connected to the instruction control interface 41. An instruction selection bus 53 and a memory access bus 54 are connected to the data memory interface 42. An execution selection bus 55 and an execution access bus 56 are connected to the execution interface 43.

The instruction control interface 41 delivers a control signal for controlling the data memory interface 42 via the memory control bus 61, and also delivers a control signal for controlling the execution interface 43 via the execution control bus 62. The data memory interface 42 selects a data memory via the memory selection bus 53 based on the control signal received from the execution control interface 41, thereby controlling the timing of the read/write operation of data via the memory access bus 54. The execution interface 43 selects an execution unit 26 or 36 via the execution selection bus 55 based on the control signal received from the instruction control interface 41 to control the input/output operation of data via the execution access bus 56, thereby reading/writing the contents of the data memory block 24 or 34 via the read access bus 63a and the write access bus 64a.

The instruction control interface 41 delivers a memory selection signal to the data memory blocks 24 and 34 via the memory control bus 61 and the memory selection bus 53, and also delivers an execution selection signal to the execution blocks 25 and 35 via the execution control bus 62 and the execution selection bus 55. The execution interface 43 reads/writes data from/to the data memory blocks 24 and 34 via the read access bus 63, write access bus 64 and memory access bus 54, and accesses execution units 26 and 36 in the execution blocks 25 and 35 via the execution access bus 56. The bus band, i.e., the number of buses capable of being accessed at a time is defined by the description of the processor block 10.

In operation of the processor block 10, an instruction read out from the program memory not shown is stored in the instruction fetch register 20. The instruction decoder 21 or 31 decodes the instruction by reading the contents of the instruction fetch register 20. After the instruction is decoded, the data memory controller 22 or 32 and the execution controller 23 or 33 delivers signals to the data memory interface 42 via the instruction control interface 41 and the memory control bus 61, and also delivers signals to the execution interface 43 via the memory control interface 41 and the execution control bus 62.

The data memory interface 42, after receiving the signals, selects a data memory via the memory selection bus 53 based on the received signal. The execution interface 43 selects one or more of execution units 26 and 36 via the execution selection bus 55, reading/writing data via the read access bus 63, write access bus 64 and memory access bus 54. Since any execution unit 26 in the execution block 25 can be accessed from the execution block 35 via the execution access bus 56, and vice versa, the calculation resources of the basic-instruction processor 11 can be used concurrently with the calculation resources of the dedicated-instruction processor 12. The number of the buses concurrently selected or accessed from the memory selection bus 53, memory access bus 54, execution selection bus 55, execution bus 56, memory control bus 61, execution control bus 62, read access bus 63 and write access bus 64 is defined by the description D4 for the flexible interface group 13, which is determined by the description D2 for the basic-instruction processor 11 and description D3 for the dedicated-instruction processor 12.

Figure 3:
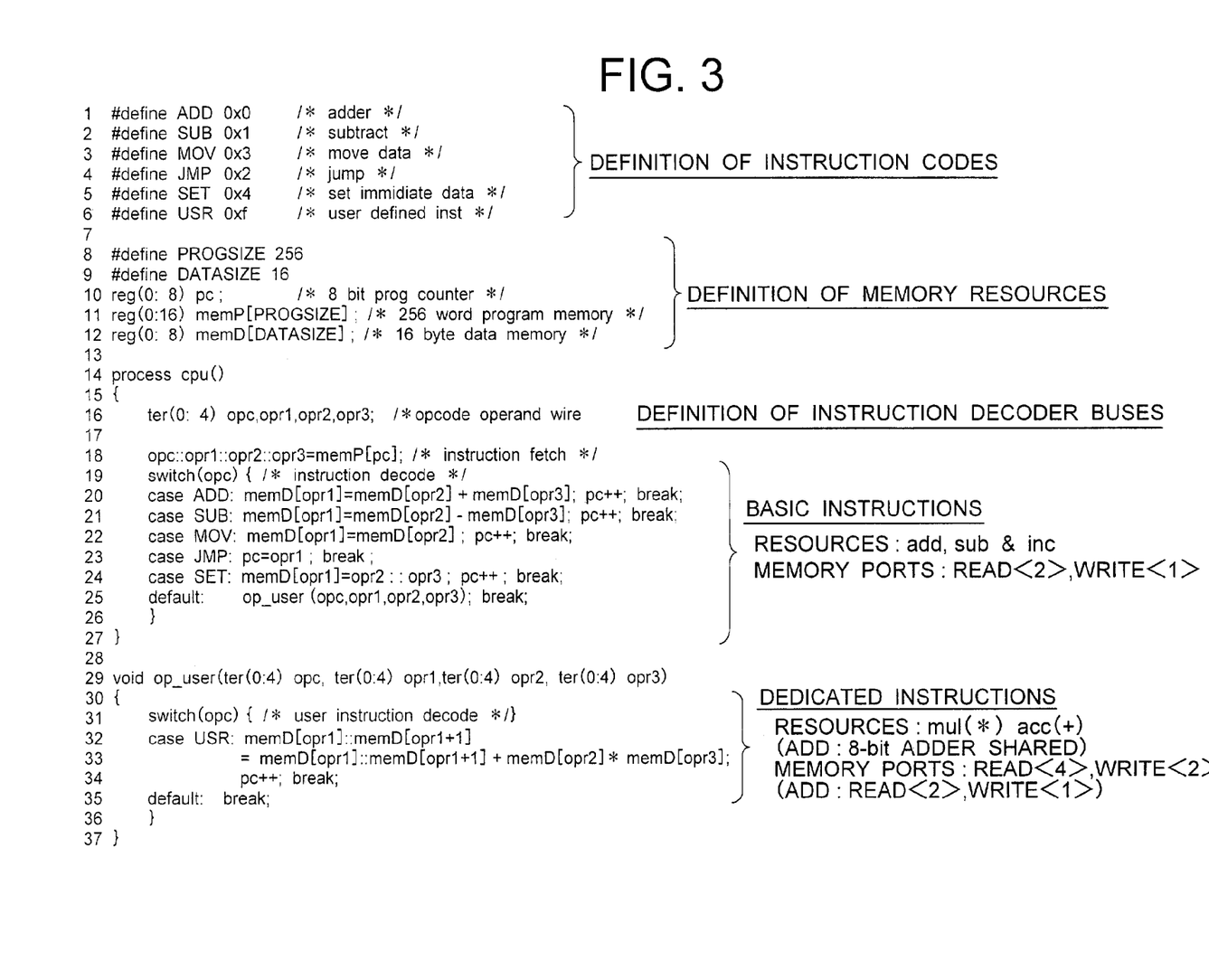
FIG. 3 is an algorithmic diagram showing the processor description in the system LSI of FIG. 2.

FIG. 3 exemplifies the description for the processor block 10. The description for the process block 10 is expressed in a high-level language which includes the C language as a base language. The description includes an instruction code definition on first to sixth rows, a memory resource definition on 8th to 12th rows, an operation description for the basic-instruction processor 11 on 14th to 27th rows, and an operation description of the dedicated-instruction processor 12 on 29th to 37th rows.

The description of FIG. 3 includes a C language description part and an additional description part, the latter being detailed hereinafter. The expression "reg(x:y)" means reservation of a storage wherein x is MSB with a y-bit length. For example "reg(0:8) pc" on the 10th row means an 8-bit program counter. Expression "ter(m:n)" means reservation of a bus signal wherein m is MSB with an n-bit length. For example, the 16th row beginning with "ter(0:4)" means that four bus lines including opc, opr1, opr2 and opr3 are reserved as four-bit bus lines. The operator "::" means a specific operator for coupling a plurality of bits. The 18th row means that four 4-bit buses opc, opr1, opr2 and opr3 are coupled together to be treated equivalent to a 16-bit bus. The term "process" on 14th row is used for the behavior synthesis tool to recognize a unit to be synthesized.

By the descriptions shown in FIG. 3, it is defined that the basic-instruction processor 11 operates for basic instructions ADD, SUB, MOV, JMP, and SET as defined on 20th to 24th rows, whereas the dedicated-instruction processor 12 operates for a user-specific instruction which includes an 8-bit multiplication and addition of the multiplied value and a value obtained by the accumulator having a 16-bit configuration and coupling two 8-bit data stored in the memories.

The basic-instruction processor 11 includes memory resources having an 8-bit configuration and 16 memories in number in the memory block 24, based on the description shown on the 9th to 12th rows. The basic-instruction processor 11 includes resources, ADD (adder), SUB (subtracter) and INC (increment) units in the execution block 25, as understood from the description. The dedicated-instruction processor 12 includes resources, MUL (multiplier) and ACC (accumulator) units in the execution block 35, as understood from the description.

As for the bus-band of the flexible interface group 13, it is understood based on the configuration of the basic-instruction processor 11 that the instruction data bus 51 should be a 16-bit bus and that the memory access bus 53 should have two 4-bit read buses and a single 4-bit write bus in order to complete the processing in a single clock cycle, as understood from 16th to 18th rows. In order to add the user-specific instruction in the dedicated-instruction processor 12, the memory access buses 53 should have therein four read buses and two write buses. That is, provision of the dedicated-instruction processor 12 necessitates addition of two read buses and single write bus.

The execution block 35 for executing the user-specific instruction in the dedicated-instruction processor 12 can access the resources, ADD and INC units, in the basic-instruction processor 11 via the execution access bus 56. The 16-bit addition executed based on the description on the 33rd row can use the 8-bit adder in the execution block 25 and an additional 8-bit adder provided for this purpose, whereby the execution block 35 need not have therein a 16-bit adder. In this way, both the processors 11 and 12 share therebetween calculation resources. It is to be noted that the basic-instruction processor 11 and the dedicated-instruction processor 12 do not operate simultaneously, and accordingly, these processors 11 and 12 can share therebetween hardware resources without a malfunction.

In the design for the system LSI according to the present embodiment, since the description D2 for the basic-instruction processor 11, description D3 for the dedicated-instruction processor 12 and the description D4 for the flexible interface group 13 are subjected to the collective behavior synthesis, the buses for transferring data between the processors 11 and 12 can be flexibly configured in accordance with the design for both the processors 11 and 12.

The high-level language describing the basic-instruction processor 11 allows the basic-instruction processor 11 to be restructured with more ease compared to the conventional RT level design for the basic-instruction processor 11. The common interface and buses shared between both the processors 11 and 12 allows the dedicated-instruction processor 12 to directly access the memory resources and calculation resources of the basic-instruction processor 11 via the buses, and vice versa, whereby an efficient circuit configuration can be obtained.

In the conventional technique, the simulation description includes portions for the basic-instruction processors, dedicated-instruction processors and bus blocks separately provided, which are combined for verification in the instruction set simulator. On the other hand, in the present embodiment, the simulation description includes all the functions for the basic-instruction processors, dedicated-instruction processors and flexible interface due to the behavior synthesis of the descriptions, whereby verification simulation can be performed with ease.

Figure 4:
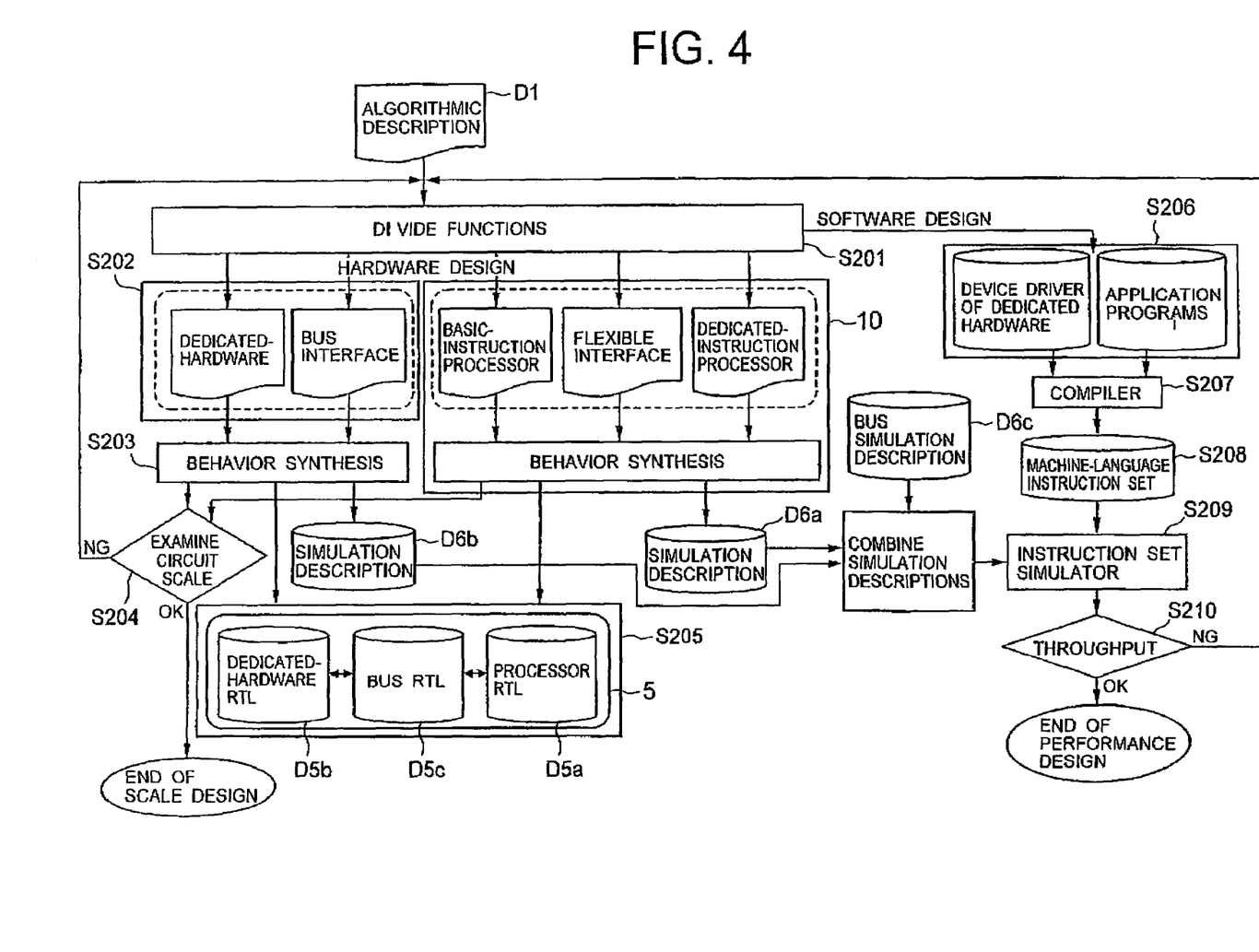
FIG. 4 is a flowchart of a combined method including the method of FIG. 1 and a conventional method both for designing system LSIs.

The processor block thus designed and including the basic-instruction processor and the dedicated-instruction processor may be used as a new basic-instruction processor in another system LSI in addition to another dedicated-instruction processor. FIG. 4 shows this example, wherein a design method of the present embodiment is combined with a conventional design method. The flowchart shown in FIG. 4 is similar to that shown in FIG. 5, except that the basic-instruction processor 11 shown in FIG. 5 is replaced in the present embodiment by the processor block 10 designed by the method of the above embodiment, as shown in FIG. 4. It is to be noted that the dedicated-instruction processor obtained in step S203 may be replaced by a hardware IP designed by a RT design technique.

The combination of the conventional design method and the design method of the above embodiment uses a behavior synthesis for a part of the functions of the system LSI. In other word, the hardware IP obtained by a conventional technique as a peripheral hardware IP may be combined with a processor designed by the embodiment to achieve a system LSI.

Since the above embodiments are described only for examples, the present invention is not limited to the above embodiments and various modifications or alterations can be easily made therefrom by those skilled in the art without departing from the scope of the present invention.

What is claimed is:

1. A method for designing a system LSI operating on specific software, said method comprising the steps of:
    dividing an algorithmic description describing functions of said system into a hardware description and a software description;
    designing a basic-instruction processor, a dedicated-instruction processor and a communication interface transferring data between said basic-instruction processor and said dedicated-instruction processor in a detailed algorithmic description based on said hardware description; and
    synthesizing said detailed algorithmic description by using a behavior synthesis to create a lower-level-language description for said basic-instruction processor, dedicated-instruction processor and communication interface.

2. The method according to claim 1, wherein each of said basic-instruction processor and said dedicated-instruction processor uses a hardware resource of the other of said basic-instruction processor and said dedicated-instruction processor.

3. The method according to claim 1, further comprising the step of determining a band of said communication interface based on said lower-level description of said basic-instruction processor, dedicated-instruction processor and communication interface.

4. The method according to claim 1, wherein said synthesizing step includes creating a simulation description for collectively simulating said basic-instruction processor, dedicated-instruction processor and communication interface.

5. The method according to claim 1, further comprising the step of simulating said basic-instruction processor, dedicated-instruction processor and communication interface based on said simulating description and a software description.

6. The method as claimed in claim 5, wherein if said simulating step reveals an overall circuit scale larger than a specific scale, the process returns to said dividing step.

7. The method as claimed in claim 5, wherein if said simulating step reveals an overall processing time length larger than a specific time length, the process returns to said dividing step.

8. The method according to claim 1, further comprising, after said synthesizing step, the step of modifying a part of a software description defining a basic instruction for said basic-instruction processor and/or dedicated instruction for said dedicated-instruction processor in an event of a change of specification or occurrence of a malfunction.

9. The method according to claim 1, wherein a part of said algorithmic description corresponding to said dedicated-instruction processor includes a redundancy circuit portion, which is to be modified in an event of a change of specification or occurrence of a malfunction.

10. The method according to claim 1, basic instructions of said basic-instruction processor are extracted from a basic-instruction processor library.

11. The method according to claim 10, wherein at least a part of dedicated instructions of said dedicated-instruction processor in said algorithmic description is stored in said basic-instruction processor library.

12. The method according to claim 1, wherein said algorithmic description includes a plurality of said dedicated-instruction processors and at least one basic-instruction processor.

13. The method according to claim 1, said algorithmic description is defined by a C language, an extended C language, and/or an object-oriented language.

14. The method according to claim 1, wherein said lower-level language description is defined by a logic synthesis register transfer level.

15. A recording medium storing therein a software defining the method of claim 1.

* * * * *